United States Patent
Zhang et al.

(10) Patent No.: US 11,194,184 B2
(45) Date of Patent: Dec. 7, 2021

(54) DISPLAY SCREEN AND ELECTRONIC DEVICE

(71) Applicant: GUANGDONG OPPO MOBILE TELECOMMUNICATIONS CORP., LTD., Guangdong (CN)

(72) Inventors: Wenzhen Zhang, Guangdong (CN); Zhongheng Lu, Guangdong (CN)

(73) Assignee: SHENZHEN HEYTAP TECHNOLOGY CORP., LTD., Guangdong (CN)

( * ) Notice: Subject to any disclaimer, the term of this patent is extended or adjusted under 35 U.S.C. 154(b) by 0 days.

(21) Appl. No.: 16/884,689

(22) Filed: May 27, 2020

(65) Prior Publication Data

US 2020/0285097 A1    Sep. 10, 2020

Related U.S. Application Data

(63) Continuation of application No. PCT/CN2018/120720, filed on Dec. 12, 2018.

(30) Foreign Application Priority Data

Jan. 18, 2018    (CN) .......................... 201810049483.2

(51) Int. Cl.
  *G02F 1/1333* (2006.01)
  *G02F 1/1335* (2006.01)
  *F21V 8/00* (2006.01)

(52) U.S. Cl.
  CPC ..... *G02F 1/133308* (2013.01); *G02B 6/0088* (2013.01); *G02F 1/133528* (2013.01); *G02F 1/133311* (2021.01); *G02F 1/133331* (2021.01)

(58) Field of Classification Search
  CPC .................................................. G02F 1/133317
  See application file for complete search history.

(56) References Cited

U.S. PATENT DOCUMENTS 5,999,238 A * 12/1999 Ihara ................. G02F 1/133615
                                                              349/58
9,305,505 B1 * 4/2016 Seen .................... G09G 3/3406
(Continued)

FOREIGN PATENT DOCUMENTS

CN    201133983    10/2008
CN    103941433    7/2014
(Continued)

OTHER PUBLICATIONS

SIPO, Second Office Action for CN Application No. 201810049483. 2, dated May 20, 2020.
(Continued)

*Primary Examiner* — Alexander P Gross
(74) *Attorney, Agent, or Firm* — Hodgson Russ LLP

(57) ABSTRACT

The disclosure provides a display screen and an electronic device. A backlight module has a second notch, a frame includes a receiving space, a backlight element is received in the receiving space, the frame is connect to a display panel, a first adhesive layer covers the connection of the frame and the display panel, a supporting member is disposed between a side wall surrounded the second notch and the backlight element, a second adhesive layer is formed between the frame, the supporting member and a lower surface of the display panel, a cover plate covers the display panel.

20 Claims, 16 Drawing Sheets

(56) References Cited

U.S. PATENT DOCUMENTS

| | | | |
|---|---|---|---|
| 2010/0202077 A1 | 8/2010 | Kim et al. | |
| 2013/0321293 A1 | 12/2013 | Park et al. | |
| 2017/0192596 A1* | 7/2017 | Lee | G06F 3/04166 |
| 2017/0371204 A1* | 12/2017 | Kaneki | H01L 51/0024 |
| 2019/0129232 A1* | 5/2019 | Itagaki | G02F 1/133512 |
| 2019/0204661 A1* | 7/2019 | Moon | H05K 5/0017 |

FOREIGN PATENT DOCUMENTS

| | | |
|---|---|---|
| CN | 104566032 | 4/2015 |
| CN | 105242451 | 1/2016 |
| CN | 105301848 | 2/2016 |
| CN | 106444146 | 2/2017 |
| CN | 106817451 | 6/2017 |
| CN | 106817452 | 6/2017 |
| CN | 106920467 | 7/2017 |
| CN | 206332719 | 7/2017 |
| CN | 108153023 | 6/2018 |
| JP | S6129821 | 2/1986 |

OTHER PUBLICATIONS

SIPO, First Office Action for CN Application No. 201810049483.2, dated Jan. 2, 2020.
WIPO, ISR for PCT/CN2018/120720, dated Feb. 27, 2019.

* cited by examiner

DISPLAY SCREEN AND ELECTRONIC DEVICE

CROSS-REFERENCE TO RELATED APPLICATIONS

This application is a continuation of International Application No. PCT/CN2018/120720, filed Dec. 12, 2018, which claims priority to Chinese Patent Application No. 201810049483.2, filed Jan. 18, 2018, the entire disclosures of which are incorporated herein by reference.

TECHNICAL FIELD

The present disclosure relates to the field of electronic device technologies, and more particularly, to a display screen and an electronic device.

BACKGROUND

With the development of the communication technology, the electronic device such as smart phones are becoming more and more popular. At present, the display screen of the phone is mainly a liquid crystal display, the liquid crystal screen generally includes a backlight module and a liquid crystal display panel, the backlight module generates light required for displaying, thereby achieving the screen display of the liquid crystal display panel.

In the related art, the backlight module of the liquid crystal display has poor waterproof performance, and water vapor easily enters the backlight module from the bonding position of the backlight module and the liquid crystal display panel, resulting in damage to the internal devices due to moisture.

SUMMARY

The embodiments of the present disclosure provide a display screen and an electronic device, which can improve the waterproof performance of the display screen and reduce the space of the display screen in the whole machine.

The embodiments of the present disclosure provide a display screen, including:
a display panel, having a first notch at the top of the display panel;
a backlight module, having a second notch at the top of the backlight module, the second notch being disposed corresponding to the first notch, wherein the backlight module includes a frame and a backlight element, the frame includes a bottom wall and a side wall surrounded the bottom wall, the bottom wall and the side wall cooperatively define a receiving space, the backlight element is received in the receiving space, a top portion of the side wall of the frame is fixedly connected to the display panel, a first adhesive layer is formed on an outer surface of the frame and a side face of the display panel, the first adhesive layer covers the connection of the frame and the display panel, a supporting member is disposed between a side wall surrounded the second notch and the backlight element, a second adhesive layer is formed among the top portion of the side wall of the frame, a top portion of the supporting member and a lower surface of the display panel; and
a cover plate, covering the display panel and the backlight module.

The embodiments of the present disclosure further provide an electronic device, which includes a housing, a display screen and a functional component. The display screen is mounted on the housing, the display screen is as the one mentioned above, the functional component is located in the first notch and the second notch.

BRIEF DESCRIPTION OF THE DRAWINGS

In order to more clearly illustrate the technical solutions in the embodiments of the present disclosure, the drawings needed to be used in the description of the embodiments will be briefly introduced below. Obviously, the drawings in the following description are just some embodiments of the present disclosure. For those skilled in the art, other drawings can be obtained according to these drawings without creative efforts.

DETAILED DESCRIPTION

Figure 1:
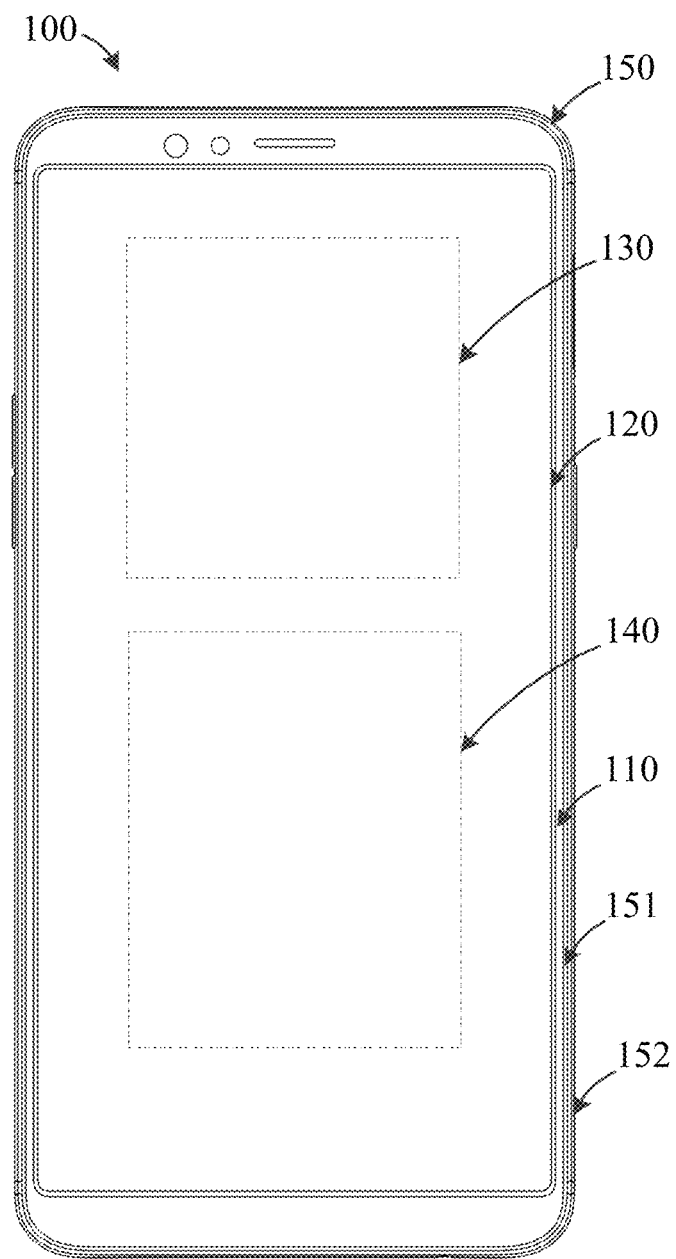
FIG. 1 is a first schematic structural diagram of an electronic device provided by an embodiment of the disclosure.

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the disclosure, all other embodiments obtained by those skilled in the art without creative work fall into the protection scope of this disclosure.

The embodiments of the present disclosure provide a display screen, wherein the display screen includes a display panel, a backlight module and a cover plate, at the top of the display panel have a first notch, at the top of the backlight module have a second notch, the second notch is disposed corresponding to the first notch. The backlight module includes a frame and a backlight element, the frame includes a bottom wall and a side wall surrounded the bottom wall, the bottom wall and the side wall cooperatively define a receiving space, the backlight element is received in the receiving space, a top portion of the side wall of the frame is fixedly connected to the display panel, a first adhesive layer is formed on the outer surface of the frame and the side face of the display panel, the first adhesive layer covers the connection of the frame and the display panel, a supporting member is disposed between a side wall surrounded the second notch and the backlight element, a second adhesive layer is formed among the top portion of the side wall of the frame, a top portion of the supporting member and a lower surface of the display panel, and the cover plate covers the display panel and the backlight module.

The display panel includes an upper polarizer, a display layer and a lower polarizer which are stacked, a top portion of the side wall of the frame is fixedly connected to the lower polarizer, the first adhesive layer is disposed on an outer surface of the frame and a side surface of the lower polarizer, to cover the connection of the frame and the lower polarizer.

The lower polarizer extends outward with respect to the frame to form a first extended portion, and the first extended portion is configured to carry the first adhesive layer.

The first adhesive layer extends to a side surface of the display layer to cover the connection of the lower polarizer and the display layer.

The first adhesive layer extends to a side surface of the upper polarizer to cover the connection of the upper polarizer and the display layer and to cover the connection of the lower polarizer and the display layer.

A first ink layer is disposed on the first adhesive layer.

A third adhesive layer is disposed on the first ink layer, and the upper polarizer extends outward with respect to the frame to form a second extended portion, the second extended portion is configured to carry the third adhesive layer.

A second ink layer is disposed respectively between the display panel and the first adhesive layer, and between the frame and the first adhesive layer.

A step portion is formed on the supporting member, and part of the backlight element is disposed on the step portion.

The second adhesive layer extends between the step portion and the part of the backlight element.

The first adhesive layer is a black light-shielding adhesive.

The display panel includes a first surface and a second surface, the first surface is fixedly connected to the cover plate, the second surface is fixedly connected to the backlight module.

The first adhesive layer is any one of a hot-melt adhesive, a photosensitive adhesive, and an optical adhesive.

The embodiments of the present disclosure provide an electronic device, including a housing, a display screen and a functional component, and the display screen is mounted on the housing, wherein the display screen includes a display panel, a backlight module and a cover plate, at the top of the display panel have a first notch, at the top of the backlight module have a second notch, the second notch is disposed corresponding to the first notch, the backlight module includes a frame and a backlight element, the frame includes a bottom wall and a side wall surrounded the bottom wall, the bottom wall and the side wall cooperatively define a receiving space, the backlight element is received in the receiving space, a top portion of the side wall of the frame is fixedly connected to the display panel, a first adhesive layer is formed on an outer surface of the frame and a side face of the display panel, the first adhesive layer covers the connection of the frame and the display panel, a supporting member is disposed between a side wall surrounded the second notch and the backlight element, a second adhesive layer is formed among the top portion of the side wall of the frame, a top portion of the supporting member and a lower surface of the display panel, the cover plate covers the display panel and the backlight module, the functional component is disposed in the first notch and the second notch.

The display panel includes an upper polarizer, a display layer and a lower polarizer which are stacked, a top portion of the side wall of the frame is fixedly connected to the lower polarizer, the first adhesive layer is disposed on an outer surface of the frame and a side surface of the lower polarizer to cover the connection of the frame and the lower polarizer.

The lower polarizer extends outward with respect to the frame to form a first extended portion, and the first extended portion is configured to carry the first adhesive layer.

The first adhesive layer extends to a side surface of the display layer to cover the connection of the lower polarizer and the display layer.

The first adhesive layer extends to a side surface of the upper polarizer to cover the connection of the upper polarizer and the display layer and cover the connection of the lower polarizer and the display layer.

A first ink layer is disposed on the first adhesive layer.

A third adhesive layer is disposed on the first ink layer, and the upper polarizer extends outward with respect to the frame to form a second extended portion, the second extended portion is configured to carry the third adhesive layer.

The embodiments of the present disclosure provide a display screen and an electronic device. Each will be described in detail below. The display screen may be disposed in the electronic device, and the electronic device may be a smart phone, a tablet computer, or the like.

Figure 2:
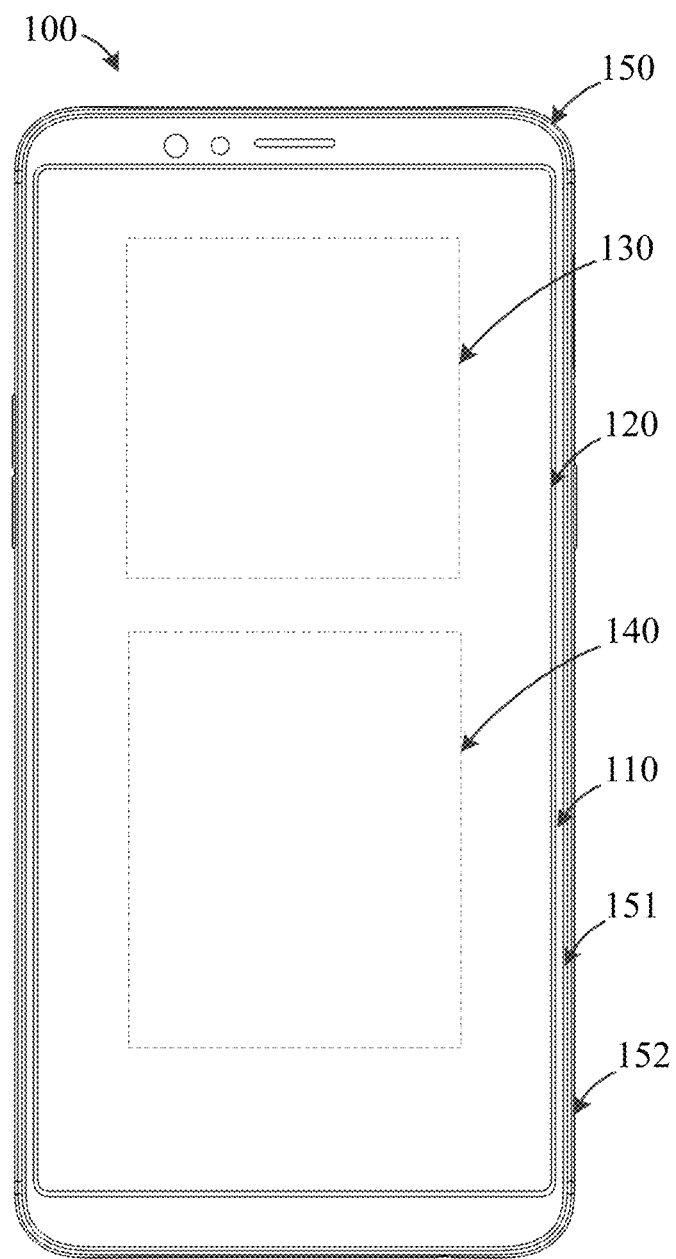
FIG. 2 is a second schematic structural diagram of an electronic device provided by an embodiment of the disclosure.

Please refer to FIG. 1 and FIG. 2, FIG. 1 is a first schematic structural diagram of an electronic device provided by an embodiment of the disclosure, FIG. 2 is a second schematic structural diagram of the electronic device provided by the embodiment of the disclosure. The electronic device 100 can include a cover plate 110, a display panel 120, a printed circuit board 130, a battery 140, a housing 150, a camera 160 and a fingerprint unlocking module 170. It should be noted that the electronic device 1 shown in FIG.

1 and FIG. 2 is not limited to the above, and may also include other components, or not include the camera 160, or not include the fingerprint unlocking module 170.

The cover plate 110 is mounted on the display panel 120 to cover the display panel 120. The cover plate 110 may be a transparent glass cover plate, so that the display screen transparent the cover plate 110 performs display. In some embodiments, the cover plate 110 may be a glass cover plate made of a material such as sapphire.

The housing 150 may include a middle frame 151 and a rear cover 152, the middle frame 151 and the rear cover 152 are combined with each other to form the housing 150. The middle frame 151 and the rear cover 152 may form a receiving space to receive the printed circuit board 130, the display panel 120, the battery 140 and the like. Further, the cover plate 110 may be fixed to the housing 150, and the cover plate 110 and the housing 150 form a closed space for receiving the printed circuit board 130, the display panel 120, the battery 140 and other elements. In some embodiments, the cover plate 110 covers the middle frame 151, the rear cover 152 covers the middle frame 151, the cover plate 110 and the rear cover 152 are located on opposite sides of the middle frame 151, and the cover plate 110 and the rear cover 152 are arranged oppositely.

In some embodiments, the housing 150 may be a metal housing made of a metal, such as a magnesium alloy, stainless steel, or the like. It should be noted that the material of the housing 150 in the embodiment of present disclosure is not limited to this, and other ways may also be adopted, for example, the housing 150 may be a plastic housing. For another example, the housing 150 is a ceramic housing. For still another example, the housing 150 may include a plastic part and a metal part, and the housing 150 may be a housing structure cooperated by the metal part and the plastic part. Specifically, the metal part may be formed first, for example, a magnesium alloy substrate is formed by injection molding, and then the plastic is injected on the magnesium alloy substrate to form a plastic substrate, thereby forming a complete housing structure.

It should be noted that the structure of the housing in the embodiment is not limited, for example, the rear cover and the middle frame are integrally formed to form a complete structure of the housing. The housing has a receiving space for receiving the printed circuit board 130, the display panel 120, the battery 140 and other components.

The printed circuit board 130 is installed in the housing 150, the printed circuit board 130 may be a mainboard of the electronic device 100, the printed circuit board 130 may integrate any one, any two, or any several function components such as motor, microphone, speaker, headphone interface, universal serial port bus interface, camera 160, distance sensor, ambient light sensor, receiver and processor.

In some embodiment, the printed circuit board 130 may be fixed in the housing 150. Specifically, the printed circuit board 130 may be screwed to the middle frame 151 by screws, or may be engaged with the middle frame 151 by a snap-fit manner. It should be noted that the way of fixing the printed circuit board 130 to the middle frame 151 is not limited to this, and may also be other ways such as a method of fixing together by a buckle and a screw.

The battery 140 is installed in the housing 150, and the battery 140 is electrically connected to the printed circuit board 130 to provide power for the electronic device 100. The housing 150 may be used as a battery cover of the battery 140. The housing 150 covers the battery 140 to protect the battery 140. Specifically, the rear cover covers the battery 140 to protect the battery 140 to reduce damage to the battery 140 due to the collision or the drop of the electronic device 100.

The display panel 120 is installed in the housing 150, and the display panel 120 is electrically connected to the printed circuit board 130 to form a display surface of the electronic device 100. The display panel 120 may include a display area 120A and a non-display area 120B. The display area 120A can be used for displaying the screen of electronic device 100 or performing touch control by a user. A top portion of the non-display area 120B is provided with openings for sound and light transmission, and the bottom of the non-display area 120B is provided with one or more functional components such as a fingerprint recognition module, a touch button and the like. The cover plate 110 is mounted on the display panel 120 to cover the display panel 120, may form the display area and the non-display area, may be the same as or different from the display panel 120.

Figure 3:
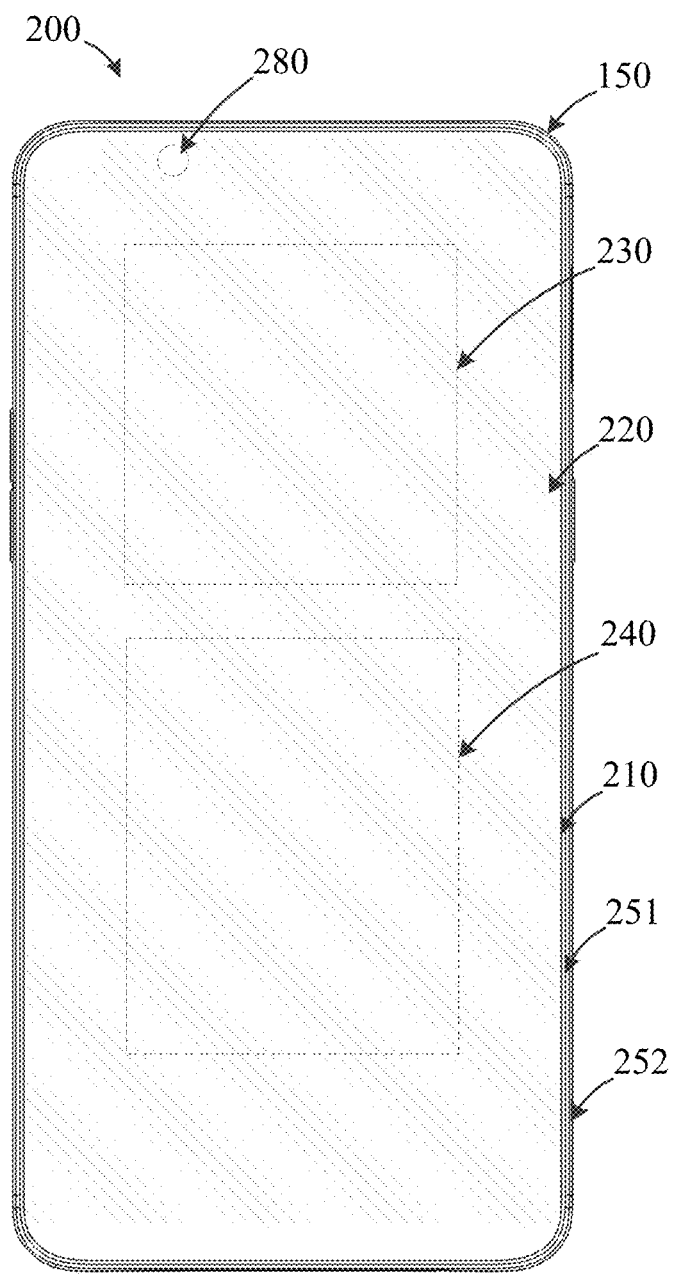
FIG. 3 is a third schematic structural diagram of an electronic device provided by an embodiment of the disclosure.

It should be noted that the structure of the display panel 120 is not limited to this. For example, the display panel 120 may be a special-shaped screen. Details can be referred to FIG. 3, FIG. 3 is a third schematic structural diagram of an electronic device provided by an embodiment of the disclosure. The electronic device in FIG. 3 is different from the electronic device in FIG. 1 in that, an electronic device 200 includes a display screen 220, a cover plate 210, a printed circuit board 230, a battery 240 and a housing 250. The display screen 220 directly forms a light-transmissive area 280 on it. Specifically, for example, the display screen 220 is provided with a through hole penetrating the display screen 220 in a thickness direction, and the light-transmissive area 280 may include the through hole, and the position of the through hole may be provided with one or more components such as a front camera, a receiver, a sensor component and the like. For still another example, the display screen 220 is provided with a non-display area, and the light-transmissive area 280 may include the non-display area. The cover plate 210 is configured for suitable for the structure of the display screen 220. It should be noted that the housing 250 may refer to the above housing 150, the printed circuit board 230 may refer to the above printed circuit board 130, and the battery 240 may refer to the above battery 140, and details are not described herein again.

Figure 4:
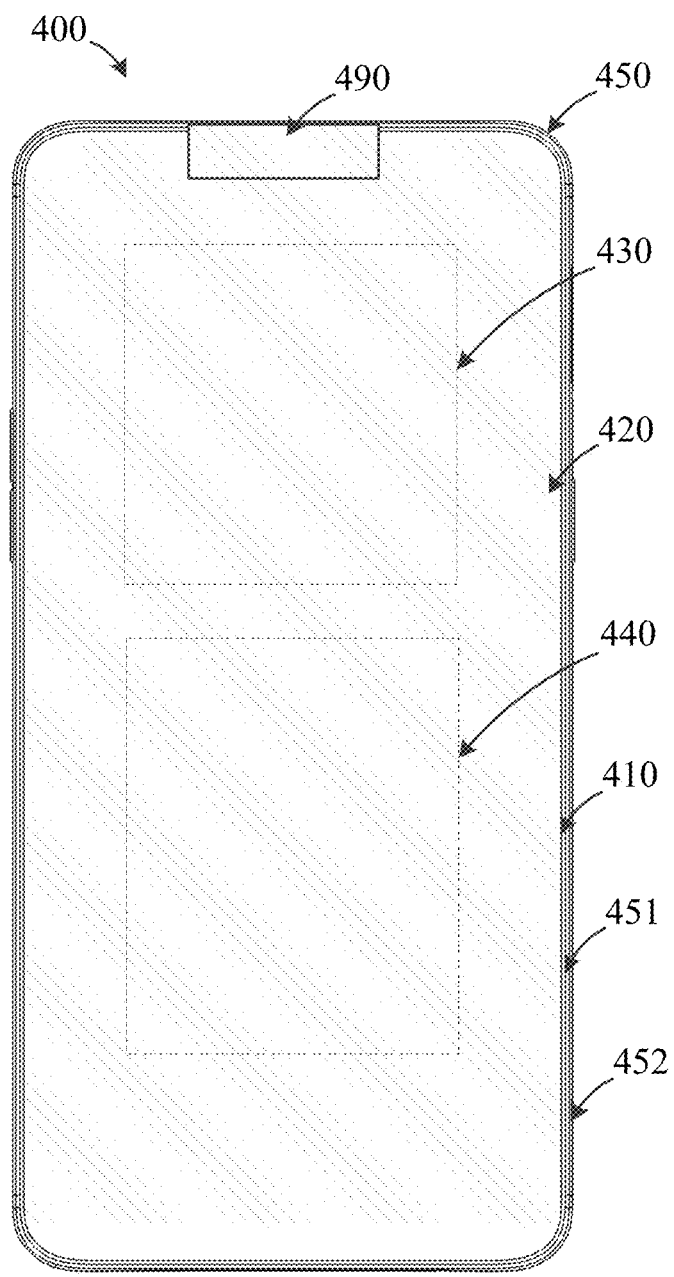
FIG. 4 is a fourth schematic structural diagram of an electronic device provided by an embodiment of the disclosure.
Figure 5:
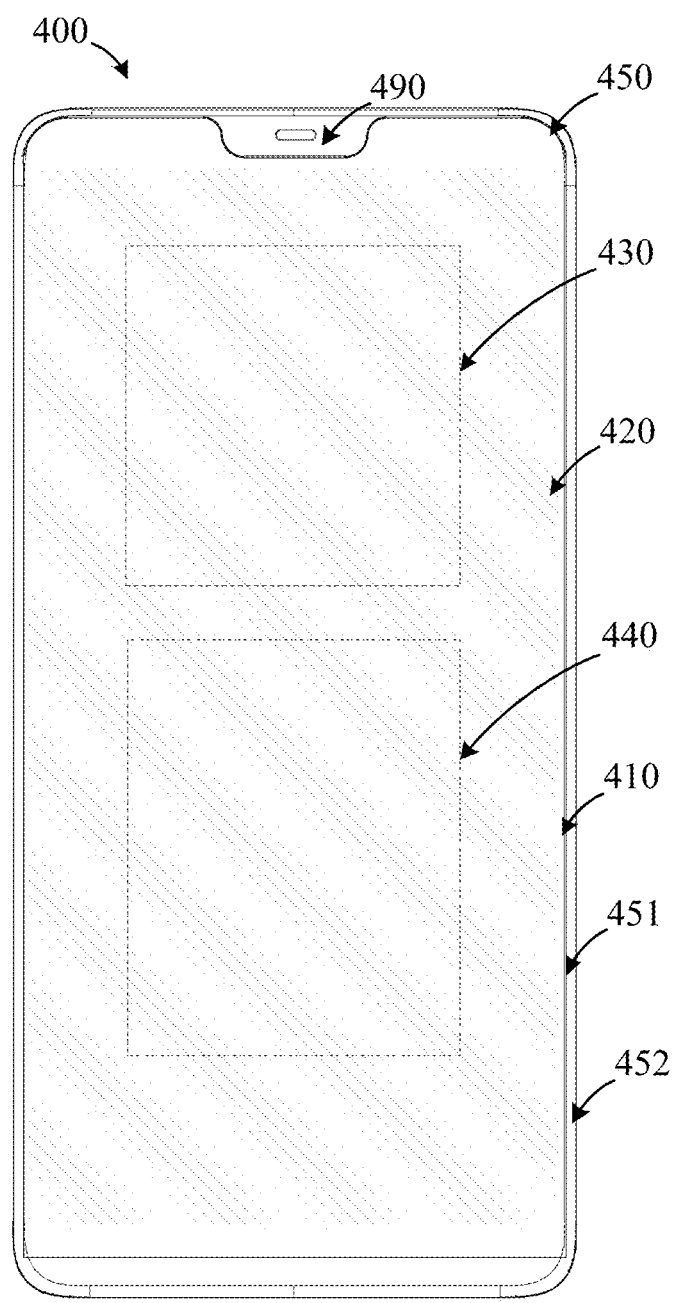
FIG. 5 is a fifth schematic structural diagram of an electronic device provided by an embodiment of the disclosure.

Please refer to FIG. 4, FIG. 4 is a fourth schematic structural diagram of an electronic device provided by an embodiment of the disclosure. The electronic device in FIG. 4 is different from the electronic device in FIG. 1 in that: an electronic device 400 includes a display screen 420, a cover plate 410, a printed circuit board 430, a battery 440 and a housing 450. A notch 490 is defined in a periphery of the display screen 420, and the notch 490 can be configured for disposing functional components such as a front camera, a receiver, a sensor component, and the like. The cover plate 410 is configured to be suitable for the structure of the notch 490. It should be noted that the housing 450 may refer to the above housing 150, the printed circuit board 430 may refer to the above printed circuit board 130, and the battery 440 may refer to the above battery 140, and details are not described herein again. In some embodiments, as shown in FIG. 5, FIG. 5 is a fifth schematic structural diagram of the electronic device provided by the embodiment of the disclosure. The notch 490 defined at the periphery of the display screen 420 may be a U-shaped notch, the functional components such as a front camera, a receiver, a sensor component and the like can be disposed in the U-shaped notch 490.

Figure 6:
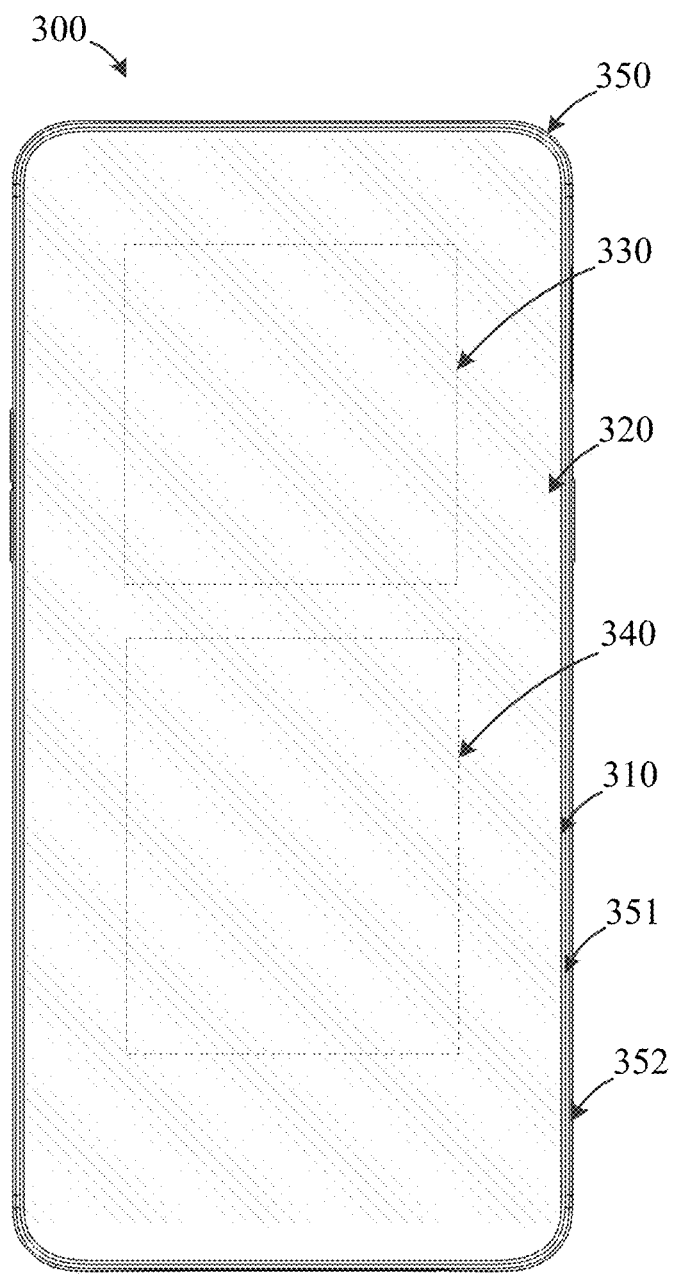
FIG. 6 is a sixth schematic structural diagram of an electronic device provided by an embodiment of the disclosure.

It should be noted that in some embodiments, the display panel 120 may not include the non-display area, and may be a full screen structure, a distance sensor, an ambient light sensor and the other components may be disposed below the display screen or at other positions. Specifically, please refer to FIG. 6, FIG. 6 is a sixth schematic structural diagram of an electronic device provided by an embodiment of the disclosure. The electronic device 300 includes a display screen 320, a cover plate 310, a printed circuit board 330, a battery 340 and a housing 350. The display screen 320 covers the housing 350 without a non-display area. The cover plate 310 is set to suitable for the size of the display screen 220. It should be noted that the housing 350 may refer to the above housing 150, the printed circuit board 330 may refer to the above printed circuit board 130, and the battery 340 may refer to the above battery 140, and details are not described herein again.

In some embodiments, the display panel 120 may be a Liquid Crystal Display (LCD), or an Organic Light-Emitting Diode (OLED).

In some embodiments, the electronic device 100 may further include a backlight module when the display panel 120 is the LCD. The backlight module is not shown in the figures, and the backlight module can refer to the backlight module in the related art.

In some embodiments, the cover plate 110, the display panel 120 and the backlight module in the electronic device 100 may form a display screen. In other words, the electronic device 100 includes the display screen, the display screen may include the cover plate 110, the display panel 120 and the backlight module. The following uses the display screen as an example for detailed description.

Figure 7:
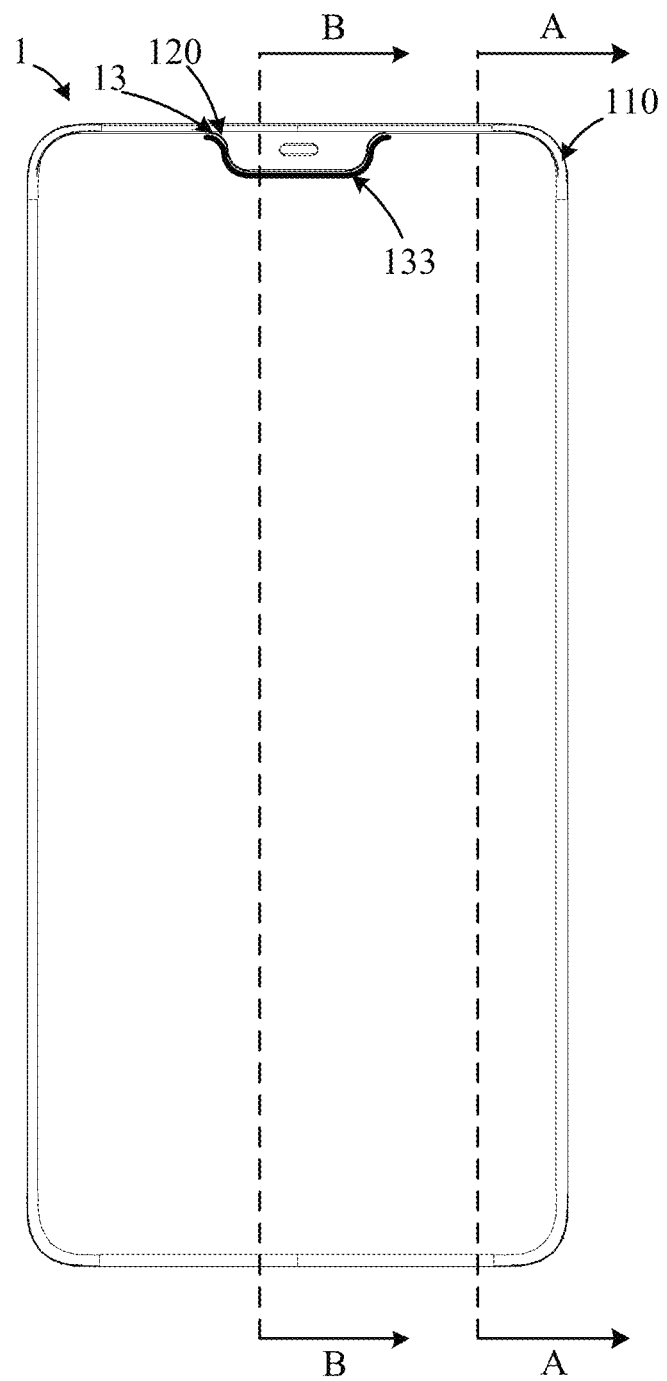
FIG. 7 is a first schematic structural diagram of a display screen provided by an embodiment of the disclosure.
Figure 8:
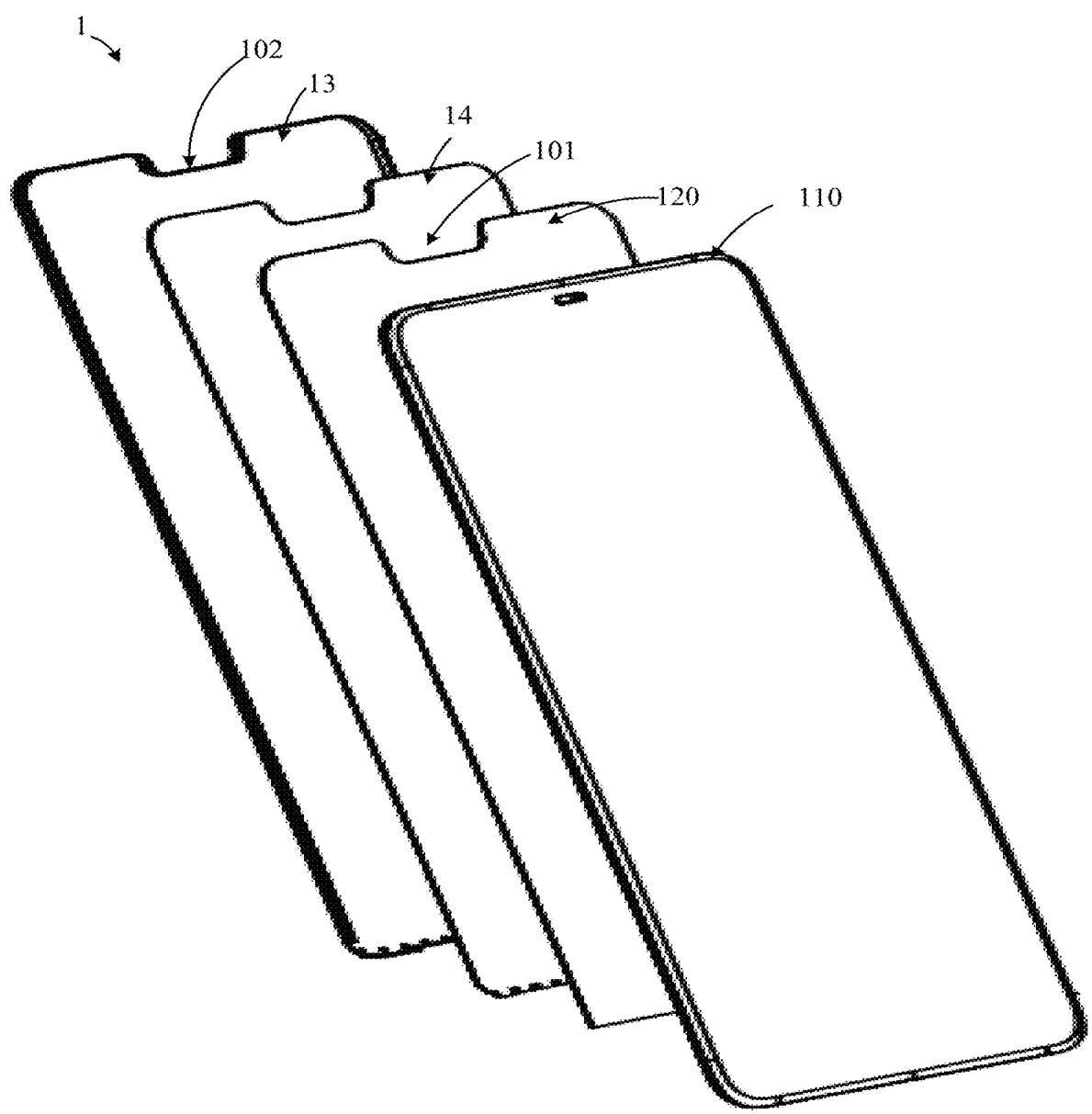
FIG. 8 is a partial splitting structure diagram of a display screen provided by an embodiment of the disclosure.

Please refer to FIG. 7 and FIG. 8, FIG. 7 is a first schematic structural diagram of a display screen provided by an embodiment of the disclosure, FIG. 8 is a partial splitting structural diagram of the display screen provided by the embodiment of the disclosure. A display screen 1 may include a cover plate 110, a display panel 120, a backlight module 13 and a waterproof adhesive 14, wherein the cover plate 110, the display panel 120, the backlight module 13 are arranged in sequence. The top of the display panel 120 has a first notch 101, the top of the backlight module 13 has a second notch 102, and the second notch 102 is disposed corresponding to the first notch 101.

Figure 9:
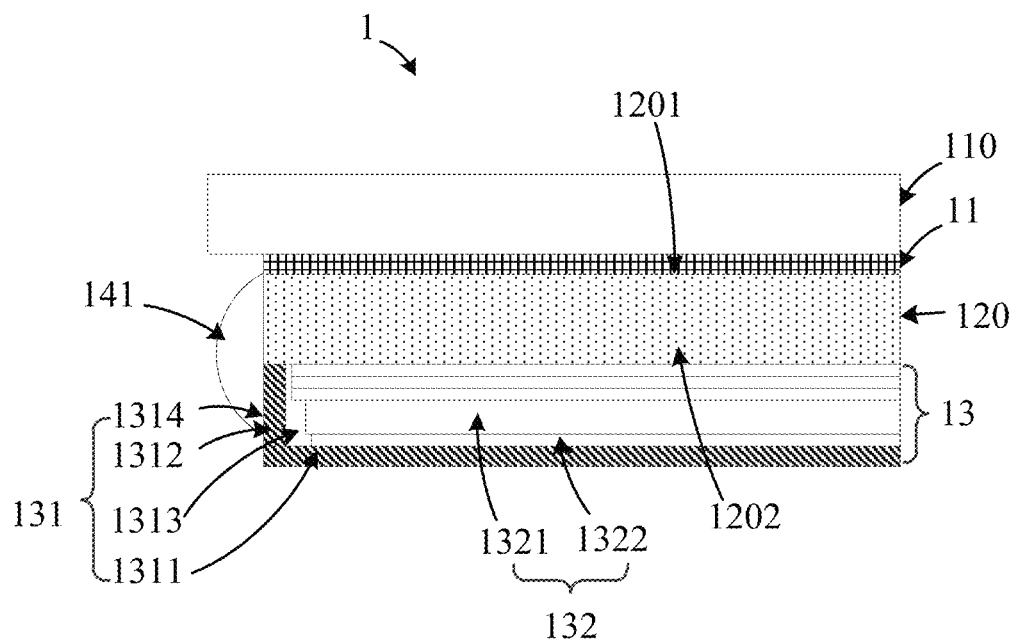
FIG. 9 is a first partial cross-sectional diagram of FIG. 7 in the direction of A-A.
Figure 10:
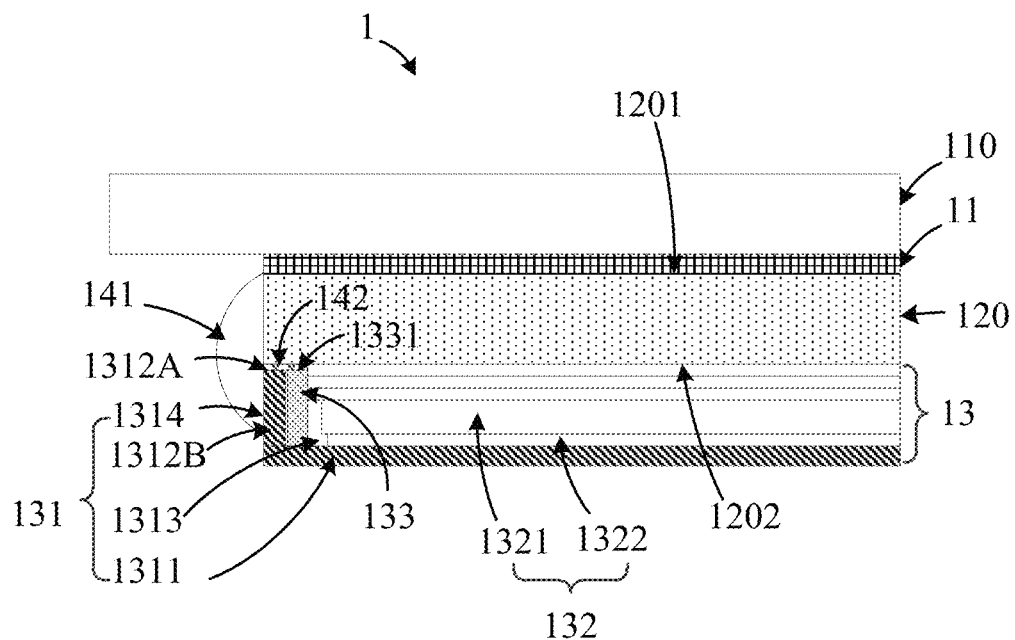
FIG. 10 is a first partial cross-sectional diagram of FIG. 7 in the direction of B-B.

Please refer to FIG. 9 and FIG. 10, FIG. 9 is a first partial cross-sectional diagram of FIG. 7 in the direction of A-A, FIG. 10 is a first partial cross-sectional diagram of FIG. 7 in the direction of B-B. The cover plate 110 is disposed on the display panel 120, specifically, the cover plate 110 may refer to the foregoing. In some embodiments, a side where the cover plate 110 is fixedly connected to the display panel 120 is defined as an inner surface of the cover plate 110, and a side where the cover plate 110 is located outside the electronic device 100 is defined as an outer surface of the cover plate 110. That is, the outer surface of the cover plate 110 can be viewed from the outside, and the inner surface of the cover plate 110 is located inside the electronic device 100.

In some embodiments, the area of the cover plate 110 may the same as the area of a side the display panel 120 fixedly connected thereto, the area of the cover plate 110 may also be larger than the area of the display panel 120.

The display panel 120 can refer to the above. In some embodiments, the display panel 120 may include a first surface 1201 and a second surface 1202. The first surface 1201 is fixedly connected the cover plate 110, and the first surface 120 may be defined as an upper surface of the display panel 120. Specifically, the display panel 120 is fixedly connected to the inner surface of the cover plate 110 through the first surface 1201 of the display panel 120 thereof. In some embodiments, the first surface 1201 of the display panel 120 is fixedly connected to the inner surface of the cover plate 110 by a layer of optical adhesive 11, in details, the optical adhesive 11 may adopt Optically Clear Adhesive (OCA).

The second surface 1202 is fixedly connected to the backlight module 13, and the second surface 1202 may be defined as a lower surface of the display panel 120.

The backlight module 13 is fixedly connected to the display panel 120 to provide a light source for the display panel 120. Specifically, the backlight module 13 includes an inner surface and an outer surface. The side where the backlight module 13 is fixedly connected to the display panel 120 is defined as the inner surface of the backlight module 13, and the side outside the display screen 1 is defined as the outer surface of the backlight module 13, the outer surface of the backlight module 13 may be mounted on the housing 150 of the electronic device 100, for example, mounted on the middle frame 151. In some embodiments, the inner surface of the backlight module 13 is fixedly connected to the second surface 1202 of the display panel 120. The display panel 120 is disposed between the cover plate 110 and the backlight module 13.

Please refer to FIG. 8, the first notch 101 is defined at the top of the display panel 120.

The second notch 102 is defined at the top of the backlight module 13, and the second notch 102 is disposed corresponding to the first notch 101.

Please continue refer to FIG. 9, which is a partial cross-sectional diagram keeping away from the positions corresponding to the first notch 101 and the second notch 102. The backlight module 13 includes a frame 131 and a backlight element 132, the frame 131 includes a bottom wall 1311 and a side wall 1312 surrounded the bottom wall 1311, the bottom wall 1311 and the side wall 1312 of the frame 131 cooperates together to define a receiving space 1313, the backlight element 132 is received in the receiving space 1313. A top portion 1312A of the side wall 1312 of the frame 131 is fixedly connected to the display panel 120, a first adhesive layer 141 is formed on an outer surface 1314 of the frame 131 and a side face of the display panel 120, the first adhesive layer 141 covers the connection of the frame 131 and the display panel 120.

Please continue refer to FIG. 10, which is a partial cross-sectional diagram at the positions corresponding to the first notch 101 and the second notch 102. A supporting member 133 is disposed between the backlight element 132 and a side wall 1312B surrounded the second notch 102. A second adhesive layer 142 is formed between the second surface 1202 of the display panel 120 and the top portion 1312A of the side wall 1312 of the frame 131, and between the second surface 1202 of the display panel 120 and a top portion 1331 of the supporting member 133.

The cover plate 110 covers the display panel 120 and the backlight module 13.

The shape of the supporting member 133 surrounds the side wall 1312B of the second notch 102 of the frame 131 of the backlight module 13 in the display screen 1 is referred to the supporting member 133 illustrated in FIG. 7.

The backlight module 13 includes the frame 131 and the backlight element 132, the backlight element 132 may further include optical components such as a light guide plate 1321, a reflective plate 1322 and the like. The frame 131 includes the bottom wall 1311 and the side wall 1312 surrounded the bottom wall 1311, the bottom wall 1311 and the side wall 1312 may be integrally formed from the same material. For example, the bottom wall 1311 and the side wall 1312 may be integrally formed using stainless steel. Alternatively, different materials may be used to form the bottom wall 1311 and the side wall 1312 according to actual needs. For example, the bottom wall 1311 may be formed of a stainless steel material with a high hardness to improve the carrying capacity of the bottom wall 1311, the side wall 1312 may be made of a plastic material to reduce the material cost. The bottom wall 1311 and the side wall 1312 formed by different materials can be integrally formed by injection molding.

In some embodiments, the backlight module 13 may further include a light source (not shown in the figure). The light source may be a side-type light source, the light source can be located at a side of the light guide plate 1321 to let the light passes through the light guide plate 1321, and the light guide plate 1321 directs the light to the display panel 120. In other embodiments, the light source may also be a back-type light source, that is, the light source is disposed under the light guide plate 1321. The reflective plate 1322 is configured to reflect the light of the light source back to the light guide plate 1321 to fully use the light of the light source.

The frame 131 is configured to support the light source, the light guide plate 1321, the reflective plate 1322 and the like. The bottom wall 1311 of the frame 131 and the side wall 1312 cooperatively define a receiving space 1313 for placing the optical components such as the light source, the light guide plate 1321 and the reflective plate 1322. For instance, the side wall 1312 surrounds the periphery of the bottom wall 1311, the side wall 1312 and the bottom wall 1311 form a recess structure, an inner space of the recess structure is the receiving space 1313. The top of the side wall 1312 of the frame 131 is connected to the second surface 1202 of the display panel 120. The first adhesive layer 141 is formed between an outer surface of the side wall 1312 facing away from the receiving space 1313 and the side face of the display panel 120 to fix the frame 131 on the display panel 120. The first adhesive layer 141 covers the connection of the top of the side wall 1312 of the frame 131 and the display panel 120, the supporting member 133 is disposed between the side wall 1312B surrounded the second notch 102 and the backlight element 132. The second adhesive layer 142 is formed among the top portion 1312A of the side wall 1312 of the frame 131, the top portion 1331 of the supporting member 133, and the second surface 1202 of the display panel 120. Therefore, the frame 131 can be adhered and fixed to the display panel 120 through first adhesive layer 141 and the second adhesive layer 142, and moisture can be prevented from entering into the backlight module 13 from the connection of the frame 131 and the display panel 120. It is beneficial to improve the waterproof performance of the backlight module 13 and prevent the internal components being damped. Expect for providing the supporting member 133 between the side wall 1312B surrounded the second notch 102 and the backlight element 132 to assist the backlight module 13 to adhere to the display panel 120 through the second adhesive layer 142, the rest side wall 1312 avoiding the second notch 102, directly fixes the frame 131 to the display panel 120 through the first adhesive layer 141, therefore, other components added in the rest frame 131 avoiding the second notch 102 to assist in bonding the display panel 120 may be omitted. For example, it is not necessary to additionally provide a plastic frame and other components in the rest frame 131 avoiding the second notch 102 to adhere to the display panel 120, the original position for setting the plastic frame is vacant, and the side wall 1312 surrounded the bottom wall 1311 as a whole can be contracted into the receiving space 1313, for example, the side wall 1312 shrinks inward by 0.25 mm, thereby reducing the space in the frame 131, the overall volume of the backlight module 13, and the space occupied by the display screen 1 in the entire machine. The supporting member 133 is disposed between the side wall 1312B surrounded the second notch 102 and the backlight element 132, and the backlight module 13 bonded to the display panel 120 through the second adhesive layer 142 can increase the bonding strength of the backlight module 13 and the display panel 120, and not affect the occupied space of the backlight module 13. In addition, the first notch 101 and the second notch 102 can be configured to place the functional components, and the non-display area of the display screen reserved for the corresponding functional components can be omitted, so as to realize the extremely narrow bezel or full-screen design of the display screen.

The first adhesive layer 141 or the second adhesive layer 142 may be a hot-melt adhesive. The hot-melt adhesive is a plastic adhesive, its physical state changes with temperature change within a certain temperature range, while its chemical characteristics remain unchanged. Compared with general glue, the hot-melt adhesive has greater adhesive strength and better curing effect, is easier to control the thickness of the glue, and can better meet the design requirements of the narrow bezel of the display. In addition, the hot-melt adhesive is thermoplastic polyurethanes, the products bonded with the hot-melt adhesive are easier to disassemble or repair. For example, the hot-melt adhesive can be PUR hot-melt adhesive, i.e., a moisture-curing reactive polyurethane hot-melt adhesive, its main constituent is isocyanate-terminated polyurethane prepolymer. The PUR hot-melt adhesive has adjustable adhesion and toughness (elasticity), and excellent bonding strength, temperature resistance, chemical resistance and aging resistance.

For example, the first adhesive layer 141 or the second adhesive layer 142 may adopt ultraviolet rays (UV) glue, which is also called photosensitive glue or ultraviolet curing glue. UV glue is a type of glue that must be cured by ultraviolet light, it can be used as an adhesive, and also can be used as a glue for paints, coatings, inks, etc. The curing principle of UV glue is that the photoinitiator (or photosensitizer) in the UV curing material absorbs ultraviolet light under the irradiation of ultraviolet rays to generate active free radicals or cations, which triggers the polymerization of monomers and cross-linking chemical reactions to turn the glue from liquid to solid in seconds. For example, the first adhesive layer 141 and the second adhesive layer may use black UV glue. The black UV glue can achieve light blocking and shading, and has the characteristics of strong adhesion, fast curing and thin dispensing. For example, the first adhesive layer 141 may be formed between the outer surface 1314 of the side wall 1312 facing away from the receiving space 1313 and the side face of the display panel 120 by using a dispensing process or a glue coating process. The second adhesive layer 142 is formed among the top portion 1312A of the side wall 1312 of the frame 131, the top portion 1331 of the supporting member 133, and the second surface 1202 of the display panel 120 by using a dispensing process or a glue coating process. The first adhesive layer 141 and the second adhesive layer 142 formed by the black UV glue can play a light shielding effect and prevent light leakage.

For example, the first adhesive layer 141 or the second adhesive layer 142 may be an Optically Clear Adhesive (OCA). OCA has characteristics of colorless and transparent, high light transmittance (full light transmittance>99%), high adhesion, high weather resistance, water resistance, high temperature resistance, and ultraviolet resistance, and it facilitates to control a thickness, can provide uniform intervals, and does not cause yellowing, peeling and deterioration when used for a long time.

Figure 11:
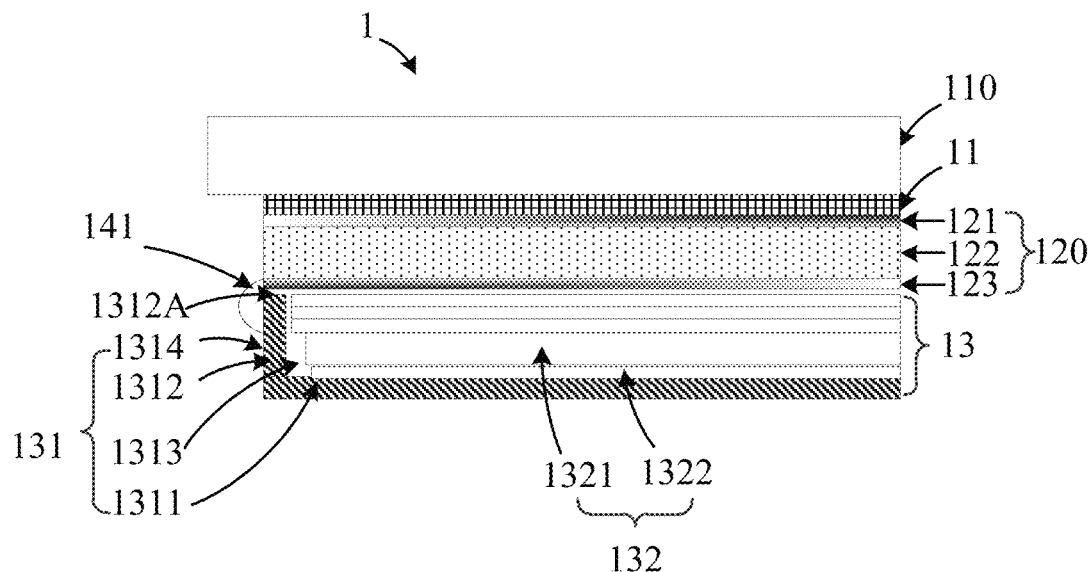
FIG. 11 is a second partial cross-sectional diagram of FIG. 7 in the direction of A-A.

In some embodiments, please refer to FIG. 11, which is a second partial cross-sectional diagram of FIG. 7 in the direction of A-A. The display panel 120 includes an upper polarizer 121, a display layer 122 and a lower polarizer 123 stacked in layers. The top of the side wall 1312A of the frame 13 is fixedly connected to the lower polarizer 123, the first adhesive layer 141 is disposed on the outer surface 1314 of the frame 131 and the side surface of the lower polarizer 123 to cover the connection of the frame 131 and the lower polarizer 123.

The display layer 122 may be an LCD panel, and the upper polarizer 121 and the lower polarizer 123 may be bonded to the display layer 122 by glue or double-sided tape.

Figure 12:
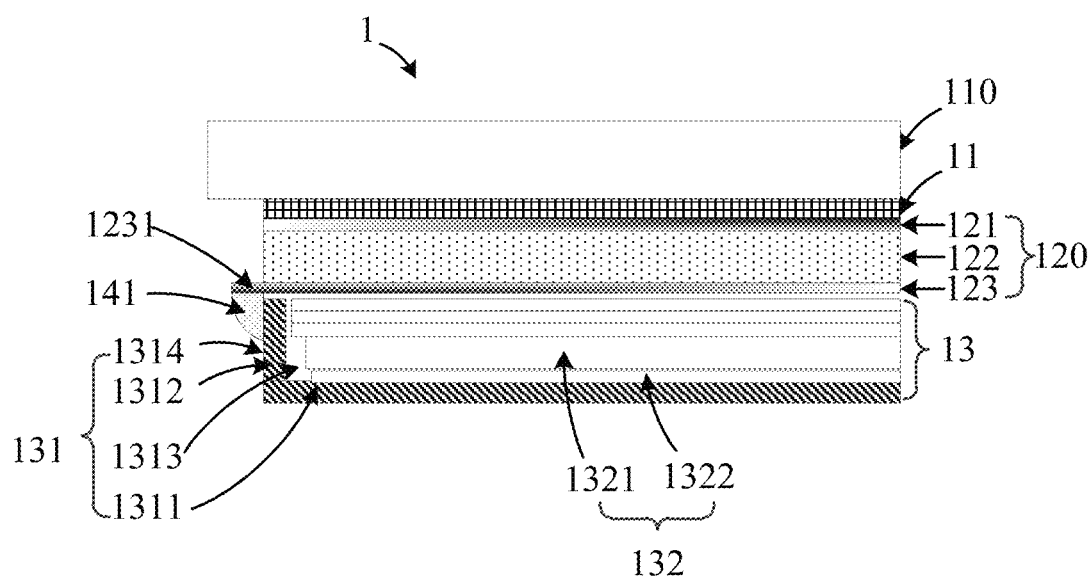
FIG. 12 is a third partial cross-sectional diagram of FIG. 7 in the direction of A-A.

In some embodiments, please refer to FIG. 12, which is a third partial cross-sectional diagram of FIG. 7 in the direction of A-A. The lower polarizer 123 extends outward with respect to the frame 131 and forms a first extended portion 1231, and the first extended portion 1231 is configured to carry the first adhesive layer 141, so that the first adhesive layer 141 is more easily hung on the lower polarizer 123 during the dispensing process to prevent the glue from flowing into and affecting other non-dispensing positions.

Figure 13:
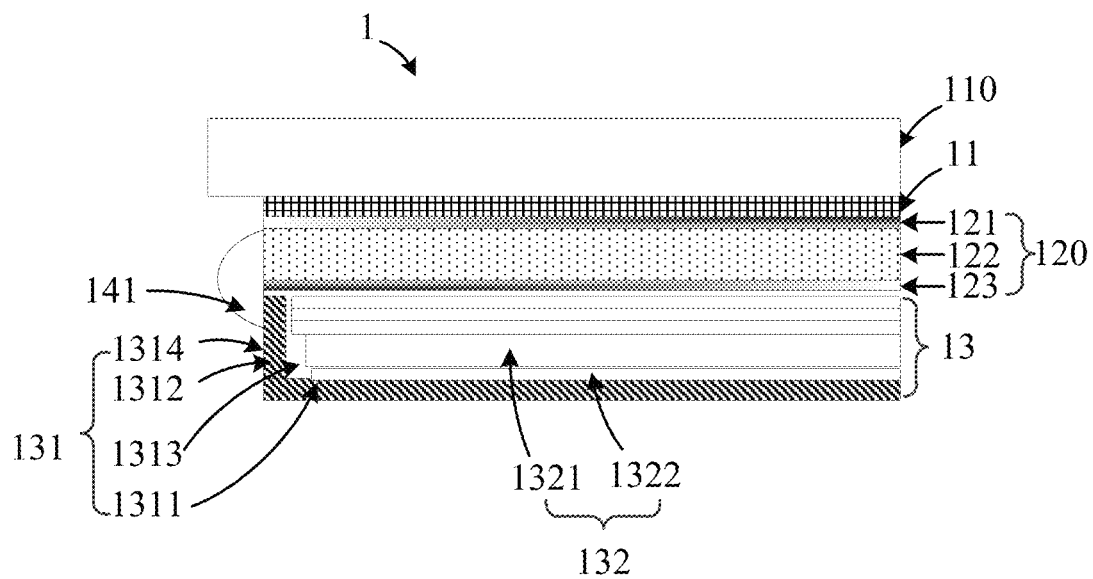
FIG. 13 is a fourth partial cross-sectional diagram of FIG. 7 in the direction of A-A.
Figure 14:
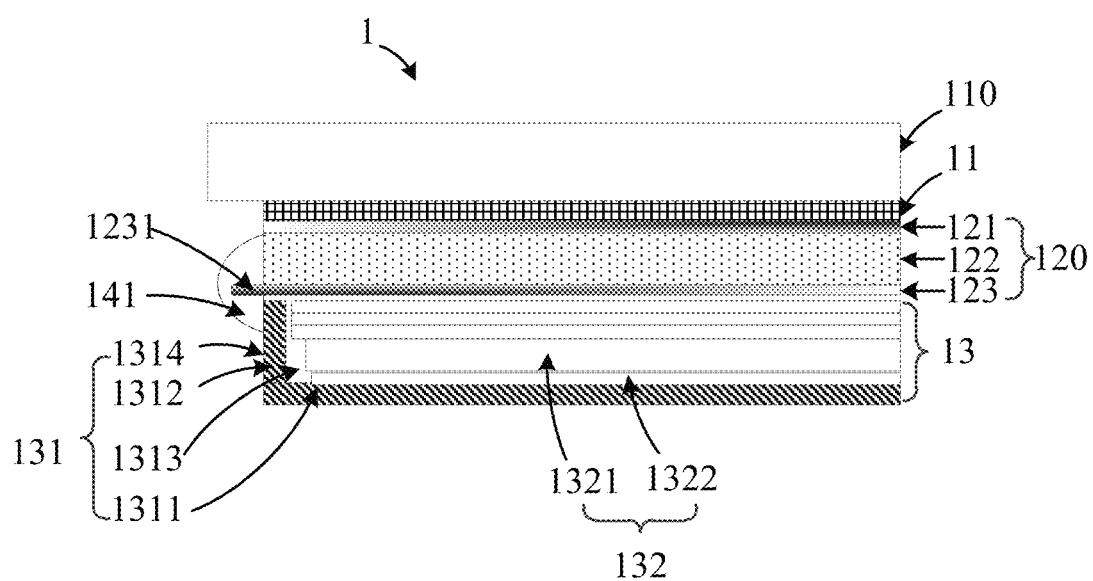
FIG. 14 is a fifth partial cross-sectional diagram of FIG. 7 in the direction of A-A.

Please refer to FIG. 13 or FIG. 14, FIG. 13 is a fourth partial cross-sectional diagram of FIG. 7 in the direction of A-A. FIG. 14 is a fifth partial cross-sectional diagram of FIG. 7 in the direction of A-A. The first adhesive layer 141 extends to a side surface of the display layer 122 to cover the connection of the lower polarizer 123 and the display layer 122, and cover the connection of the frame 131 and the lower polarizer 123, thereby increasing the bonding area of the first adhesive layer 141 and improving the waterproof performance of the backlight module 13. The differences between FIG. 14 and FIG. 13 are in that the lower polarizer 123 extends outward with respect to the frame 13 to form a first extended portion 1231. The first adhesive layer 141 can increase the bonding area by covering the first extended portion 1231, and can firmly bind the display panel 120 and the frame 13.

Figure 15:
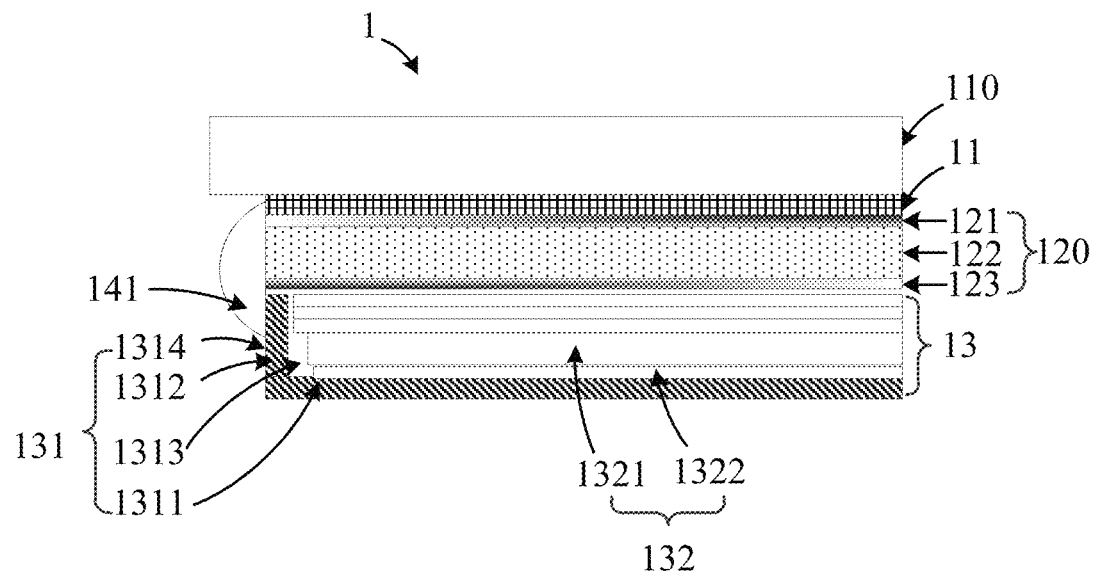
FIG. 15 is a sixth partial cross-sectional diagram of FIG. 7 in the direction of A-A.
Figure 16:
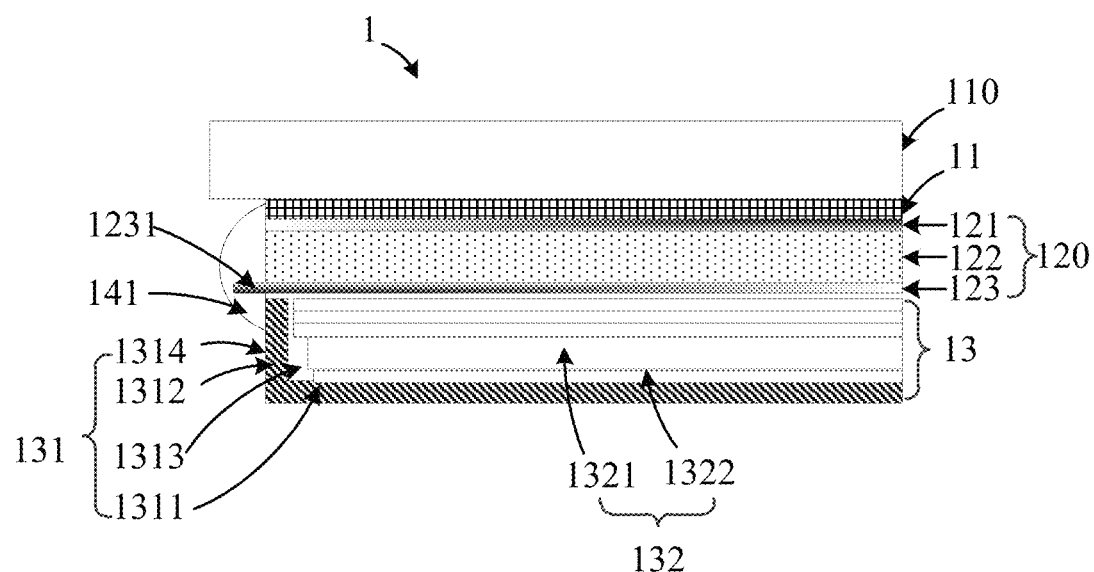
FIG. 16 is a seventh partial cross-sectional diagram of FIG. 7 in the direction of A-A.

Please refer to FIG. 15 or FIG. 16, FIG. 15 is a sixth partial cross-sectional diagram of FIG. 7 in the direction of A-A. FIG. 16 is a seventh partial cross-sectional diagram of FIG. 7 in the direction of A-A. The first adhesive layer 141 extends to a side surface of the upper polarizer 121 to cover the connection of the upper polarizer 121 and the display layer 122, cover the connection of the lower polarizer 123 and the display layer 122 and also cover the connection of the frame 131 and the lower polarizer 123 to increase the bonding area of the first adhesive layer 141, and improve the waterproof performance of the backlight module 13.

Figure 17:
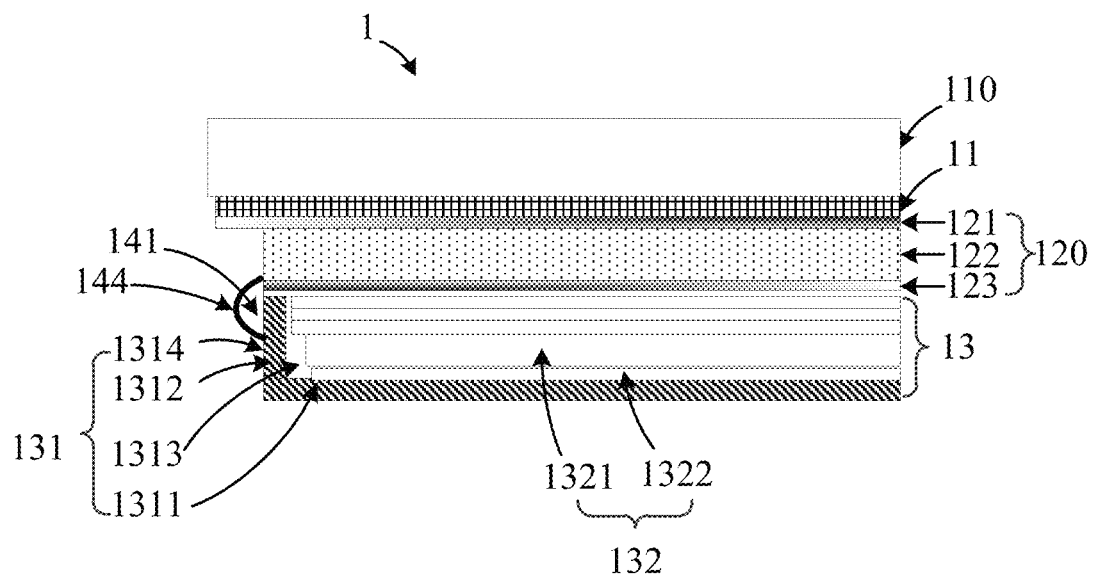
FIG. 17 is an eighth partial cross-sectional diagram of FIG. 7 in the direction of A-A.

In some embodiments, please refer to FIG. 17, which is an eighth partial cross-sectional diagram of FIG. 7 in the direction of A-A. The differences between FIG. 17 and FIG. 10 are that: a first ink layer 144 is disposed on the first adhesive layer 141. The first ink layer 144 may be a black ink layer. The first ink layer 144 can prevent light leakage from a display module 20.

Figure 18:
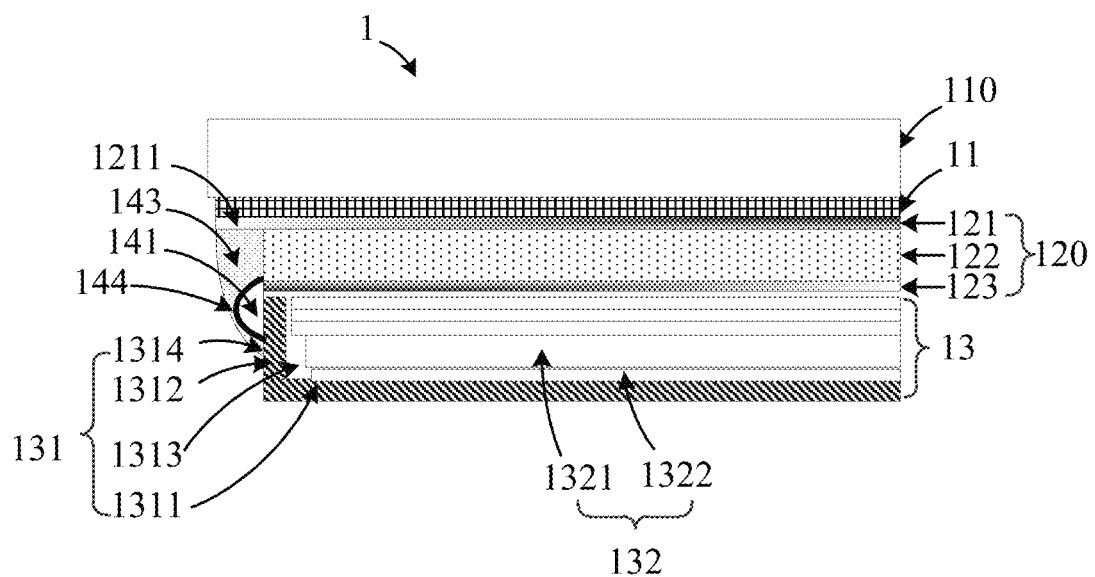
FIG. 18 is a ninth partial cross-sectional diagram of FIG. 7 in the direction of A-A.

In some embodiments, as shown in FIG. 18, which is a ninth partial cross-sectional diagram of FIG. 7 in the direction of A-A. The differences between FIG. 18 and FIG. 18 are that: a third adhesive layer 143 is disposed on the first ink layer 144, the upper polarizer 121 extends outward with respect to the frame 131 and forms a second extended portion 1211, and the second extended portion 1211 is configured to carry the third adhesive layer 143.

The first ink layer 144 is formed by a black ink with a high surface energy or low contact angle. The ink with high surface energy or low contact angle has high viscosity, and the adhesion between the first adhesive layer 141 and the third adhesive layer 143 can be increased by the first ink layer 144. By providing the third adhesive layer 143, the waterproof performance of the waterproof glue 14 can be further strengthened.

The adhesion occurs between the interfaces that are in contact with each other, and depends both of the wettability and the adhesive force. Wetting is the phenomenon of uniform spreading of a liquid under the action of intermolecular forces on the surface of a solid, that is, the affinity of the liquid for the solid. The wetting of liquids is mainly caused by surface tension, both liquids and solids have surface tension, for liquid it is called surface tension, and for the solid it is called surface energy. Wettability is mainly determined by the surface energy of the adhesive and the adherend. Wetting of the adherend by the adhesive is only a prerequisite for bonding, and it must also be able to form an adhesive force to achieve the purpose of bonding. The adhesive force refers to the connecting force between the adhesive and the adherend. Its generation depends not only on the structure and the state of the adhesive and the surface of the adherend, but is also closely related to the process conditions of the bonding process. The adhesive force refers to the acting force or the binding force of the adherend and the adhesive at the interfaces, including mechanical fitting force, intermolecular force, and chemical bonding force. Wetting is a prerequisite for bonding. The relationship between the surface energy and the wettability is that the magnitude of solid surface energy determines its wettability. The basic condition for a liquid to spread spontaneously on a solid surface is that the surface energy of the liquid is smaller than the surface energy of the solid. The higher the surface energy of a solid, the better it is for spreading, and vice versa. The same liquid has good wettability on a solid surface with a large surface energy. Therefore, the surface energy is an important factor affecting the bonding strength. Decreasing the surface energy of the adhesive or increasing the surface energy of the adherend can enhance the wettability of the adhesive on the adherend, which improves bond strength. In this embodiment, a first adhesive layer 141 is disposed on the connecting position of the frame 131 and the lower polarizer 123, when the first adhesive layer 141 is solidified, the first ink layer 144 is applied to the first adhesive layer 141, and then the third adhesive layer is provided on the first ink layer 144. The third adhesive layer 143 can be used as an adhesive, and the second adhesive layer 143 is solidified can be used as a solid adherend, the first ink layer 144 with high surface energy increases the bonding strength between the first adhesive layer 141 and the third adhesive layer 143.

A contact angle is defined as the angle between the gas-liquid interface and the liquid-solid interface at the intersection of the three-phase interface of solid, liquid and gas. The contact angle is a scale to show the humidity of the solid surface and measured by sessile drop. A low contact angle indicates high humidity (hydrophilicity) and the surface is easy to stick. A high contact angle indicates the surface is hydrophobic and the surface adhesion is poor. In this embodiment, the adhesion strength between the first adhesive layer 141 and the third adhesive layer 143 is increased by the first ink layer 144 having a low contact angle.

In some embodiments, the first ink layer 144 may be a black ink layer. The first ink layer 144 may increase the bonding strength between the first adhesive layer 141 and the third adhesive layer 143, and prevent the backlight module 13 from leaking light.

Figure 19:
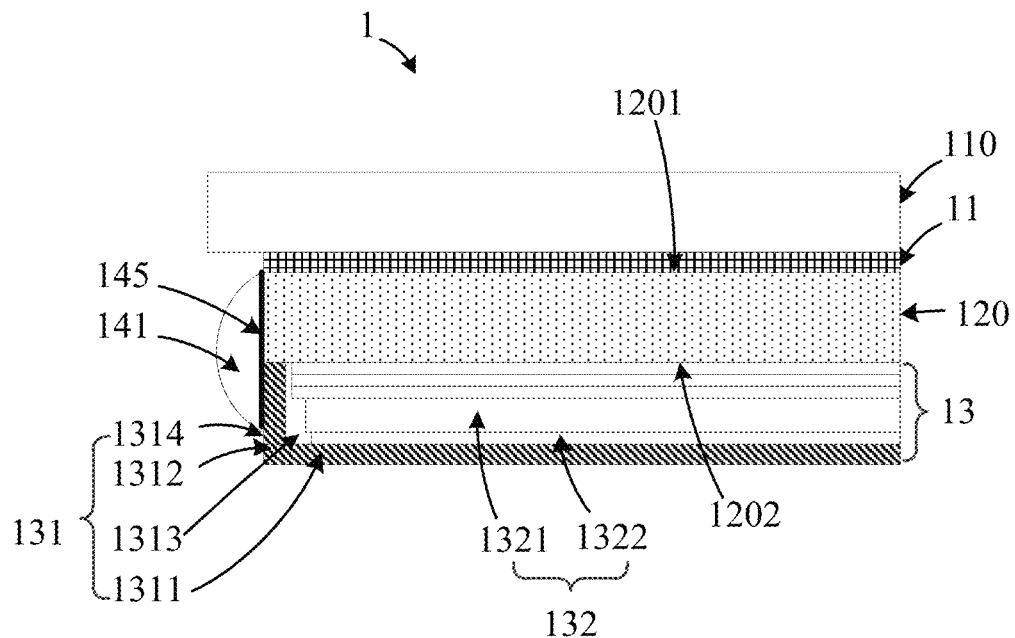
FIG. 19 is a tenth partial cross-sectional diagram of FIG. 7 in the direction of A-A.

In some embodiments, as shown in FIG. 19, which is a tenth partial cross-sectional diagram of FIG. 7 in the direction of A-A. The differences between FIG. 19 and FIG. 9 are that the second ink layer 145 is provided between the display panel 120 and the first adhesive layer 141, the frame 131 and the first adhesive layer 141 respectively. The second ink layer 145 may be formed by an ink with high surface energy or an ink with a low contact angle. For example, the second ink layer 145 may be a black ink layer. The second ink layer 145 can increase the bonding strength between the first adhesive layer 141 and the display panel 120, the first adhesive layer 141 and the frame 131, and can prevent the backlight module 13 from leaking light.

Figure 20:
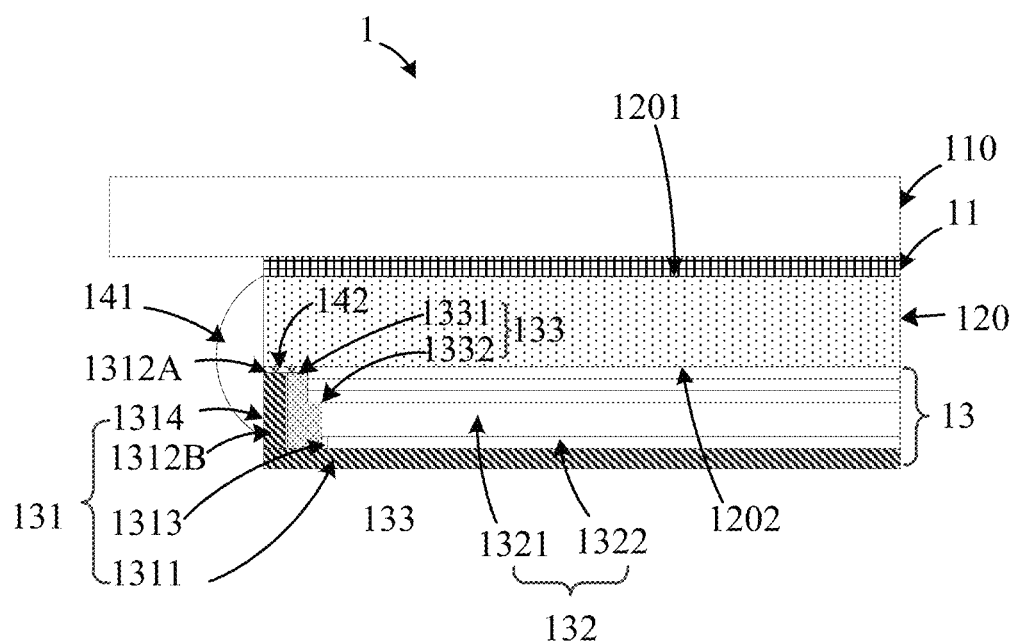
FIG. 20 is a second partial cross-sectional diagram of FIG. 7 in the direction of B-B.

In some embodiments, as shown in FIG. 20, which is a second partial cross-sectional diagram of FIG. 7 in the direction of B-B. The differences between FIG. 20 and FIG. 9 are that a step portion 1332 is formed on the supporting member 133, and part of the backlight element 132 is disposed on the step portion 1322. The backlight element is supported and fixed by the step portion 1322 formed on the supporting member 133, so that the backlight module 13 and the display panel 120 are more easily bonded during the dispensing process.

Figure 21:
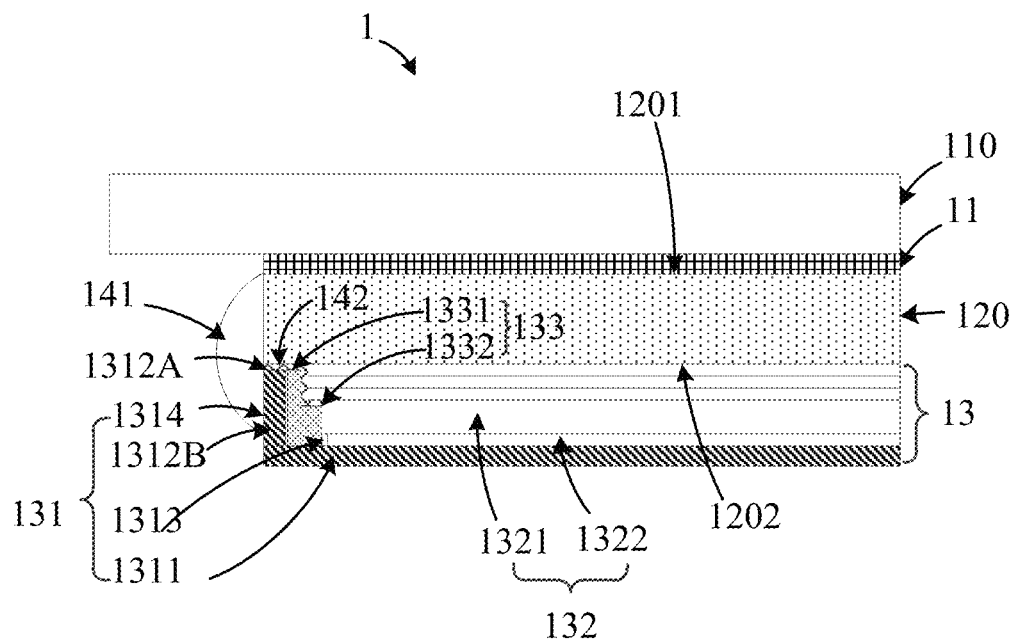
FIG. 21 is a third partial cross-sectional diagram of FIG. 7 in the direction of B-B.

In some embodiments, as shown in FIG. 21, which is a third partial cross-sectional diagram of FIG. 7 in the direction of B-B. The differences between FIG. 21 and FIG. 20 are that the second adhesive layer 142 extends between the step portion 1322 and the part of the backlight element 132. The second adhesive layer 142 is configured to fixedly connect the backlight element 132 and the frame 131, and fixedly connect the display panel 120 and the frame 131. The second adhesive layer 142 can enhance the bonding strength between the display panel 120 and the frame 131, and improve the waterproof effect of the backlight module 13.

In some embodiments, the second adhesive layer 142 is a black light-shielding adhesive. The second adhesive layer 142 formed by the black light-shielding glue can play a light-shielding effect and prevent light leakage.

The display screen 1 provided in the embodiments includes the display panel 120, the backlight module 13 and the cover plate 110. At the top of the display panel 120 have a first notch 101, at the top of the backlight module 13 have a second notch 102, the second notch 102 is disposed corresponding to the first notch 101. The backlight module 13 includes a frame 131 and a backlight element 132, the frame 131 includes a bottom wall 1311 and a side wall 1312 surrounded the bottom wall 1311, the bottom wall 1311 and the side wall 1312 cooperatively define a receiving space 1313, the backlight element 132 is received in the receiving space 1313, a top portion of the side wall 1312 of the frame 131 is fixedly connected to the display panel 120. The first adhesive layer 141 is formed on the outer surface 1314 of the frame 131 and the side face of the display panel 120, the first adhesive layer 141 covers the connection of the frame 131 and the display panel 120, a supporting member 133 is disposed between a side wall 1312B surrounded the second notch 102 and the backlight element 132. The second adhesive layer 142 is formed among the top portion 1312A of the side wall 1312 of the frame 13, the top portion 1331 of the supporting member 133 and a second surface 1202 of the display panel 120, and the cover plate 110 covers the display panel 120 and the backlight module 13. The embodiments can prevent moisture from entering into the backlight module 13 from the connection of the frame 131 and the display panel 120, which is beneficial to improve the waterproof performance of the backlight module 13 and prevent the internal components from being damped. Expect for providing the supporting member 133 between the side wall 1312B surrounded the second notch 102 and the backlight element 132 to assist the backlight module 13 to adhere to the display panel 120 through the second adhesive layer 142, the rest side wall 1312 avoiding the second notch 102, directly fixes the frame 131 to the display panel 120 through the first adhesive layer 141, therefore, other components added in the rest frame 131 avoiding the second notch 102 to assist in bonding the display panel 120 may be omitted, reducing the space in the frame 131, the overall volume of the backlight module 13, and the space occupied by the display screen 1 in the entire machine. The supporting member 133 is disposed between the side wall 1312B surrounded the second notch 102 and the backlight element 132, and the backlight module 13 bonded to the display panel 120 through the second adhesive layer 142 can increase the bonding strength of the backlight module 13 and the display panel 120, and not affect the occupied space of the backlight module 13. In addition, the first notch 101 and the second notch 102 can be configured to place the functional components, and the non-display area of the display screen reserved for the corresponding functional components can be omitted, so as to realize the extremely narrow bezel or full-screen design of the display screen.

Figure 22:
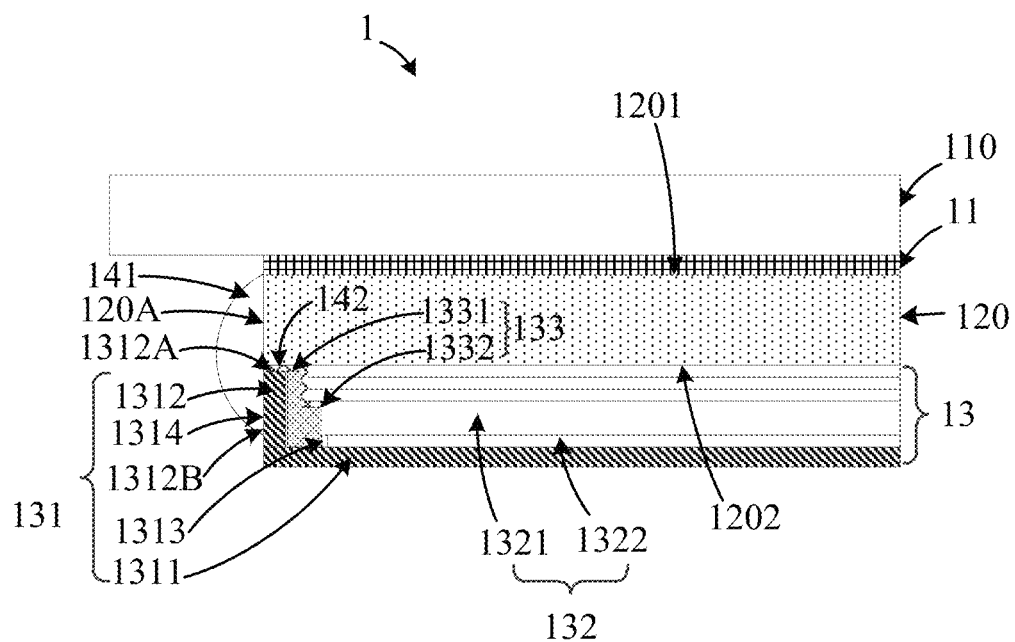
FIG. 22 is an eleventh partial cross-sectional diagram of FIG. 7 in the direction of B-B.

In some embodiments, the display screen 1 includes a display panel 120, a backlight module 13, a first adhesive layer 141, a second adhesive layer 142 and a cover plate 110. The display panel 120 defines a first notch 101, the backlight module 13 includes a frame 131, a backlight element 132 and a supporting member 133. As can be seen from FIG. 22, which is an eleventh partial cross-sectional diagram of FIG. 7 in the direction of B-B. The frame 131 includes a bottom wall 1311 and a side wall 1312 connected to the bottom wall 1311 thereby defining a receiving space 1313, the side wall 1312 includes a first portion 1312A and a second portion 1312B connected to the first portion 1312A, the second portion 1312B defines a second notch 102, the second notch 102 corresponds to the first notch 101, the supporting member 133 and the backlight element 132 are received in the receiving space 1313, and the supporting member 133 is positioned between the second portion 1312B and the backlight element 132. The first adhesive layer 141, formed on a side surface of the second portion 1312B and a side face 120A of the display panel 120, thereby connecting the second portion 1312B and the display panel 120. The second adhesive layer 142, formed between a top surface of the first portion 1312A, a top surface 1331 of the supporting member 133 and a second surface 1202 of the display panel 120. The cover plate 110 disposes on the display panel 120 and covers the first notch 101 and the second notch 102. Further, the second adhesive layer 142 is disposed between the side face 120A of the display panel 120, the side surface of the second portion 1312B and the first adhesive layer 141.

In some embodiment, the display panel 120 includes an upper polarizer 121, a display layer 122 and a lower polarizer 123 stacked in layers, a top surface of the first portion 1312A is fixedly connected to the lower polarizer 123 by the second adhesive layer 142, the first adhesive layer 141 is formed on a side surface of the second portion 1312B and a side surface of the lower polarizer 123. The lower polarizer 123 extends into the first notch 101 and forms a first extended portion 1231, and the first adhesive layer 141 is further disposed on the first extended portion 1231. The first adhesive layer 141 is formed on a side surface of the side surface of the display panel 120, and formed on a side surface of the upper polarizer 121. Further, the display panel 120 includes a first surface 1201 and a second surface 1202, the first surface 1201 is fixedly connected to the cover plate 110, the second surface 1202 is fixedly connected to the backlight module 13.

In some embodiments, a first ink layer 144 disposes on the first adhesive layer 141. A third adhesive layer 143 is disposed on the first ink layer 144, and the upper polarizer 121 extends into the first notch 101 to form a second extended portion 1211, the third adhesive layer 143 is further disposed on the second extended portion 1211.

Figure 23:
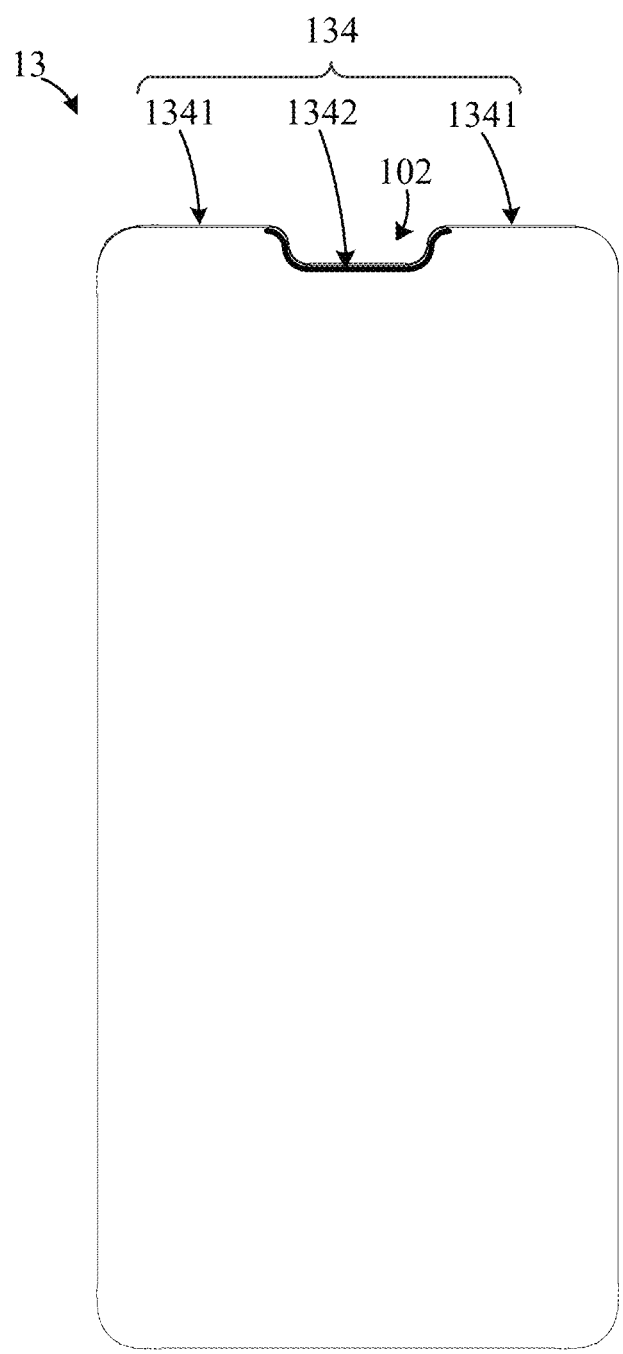
FIG. 23 is a schematic structural diagram of a backlight module.

As can be seen from FIG. 23, which is a schematic structural diagram of a backlight module. The backlight module 13 includes a side wall 134, and the side wall 134 includes two flat portions 1341 and a curved portion 1342 connected between the two flat portions 1341, the second notch 102 is defined in the curved portion 1342, the first adhesive layer 141 is formed on side surfaces of the flat portions 1341 and the side face of the display panel 120, the second adhesive layer 142 is formed between a top surface of the curved portion 1342, the top surface of the supporting member 133, and the lower surface of the display panel 120.

The display screen and the electronic device provided in the embodiments of the present disclosure have been described in detail above. Specific examples are used herein to explain the principles and implementation of the present disclosure. The descriptions of the above embodiments are only used to help understand the present disclosure. At the same time, for those skilled in the art, according to the idea of this disclosure, there will be changes in the specific implementation and scope of disclosure. In summary, the content of this description should not be understood as a limitation on this disclosure.

What is claimed is:

1. A display screen, the display screen comprising:
   a display panel, defining a first notch;
   a backlight module, comprising a frame, a backlight element and a supporting member, wherein the frame comprises a bottom wall and a side wall connected to the bottom wall thereby defining a receiving space, the side wall comprises two flat portions and a curved portion connected between the two flat portions, the curved portion defines a second notch, the second notch corresponds to the first notch, the supporting member and the backlight element are received in the receiving space, and the supporting member is only positioned between the curved portion and the backlight element and not positioned between the flat portions and the backlight element;
   a first adhesive layer, formed on a side surface of the curved portion and a side face of the display panel, thereby connecting the curved portion and the display panel;
   a second adhesive layer, formed between a top surface of the flat portion, a top surface of the supporting member and a lower surface of the display panel; and
   a cover plate, disposed on the display panel and covering the first notch and the second notch.

2. The display screen as claimed in claim 1, wherein the display panel comprises an upper polarizer, a display layer and a lower polarizer stacked in layers, a top surface of the flat portion is fixedly connected to the lower polarizer by the second adhesive layer, the first adhesive layer is formed on the side surface of the curved portion and a side surface of the lower polarizer.

3. The display screen as claimed in claim 2, wherein the lower polarizer extends into the first notch and forms a first extended portion, and the first adhesive layer is further disposed on the first extended portion.

4. The display screen as claimed in claim 2, wherein the first adhesive layer is formed on a side surface of the display layer to cover the connection of the lower polarizer and the display layer.

5. The display screen as claimed in claim 2, wherein the first adhesive layer is formed on a side surface of the upper polarizer to cover the connection of the upper polarizer and the display layer and to cover the connection of the lower polarizer and the display layer.

6. The display screen as claimed in claim 2, wherein a first ink layer is disposed on the first adhesive layer.

7. The display screen as claimed in claim 6, wherein a third adhesive layer is disposed on the first ink layer, and the upper polarizer extends into the first notch to form a second extended portion, the third adhesive layer is further disposed on the second extended portion.

8. The display screen as claimed in claim 1, wherein a second ink layer is disposed respectively between the side face of the display panel, the side surface of the second portion and the first adhesive layer.

9. The display screen as claimed in claim 1, wherein the supporting member comprises a step portion, and part of the backlight element is disposed on the step portion.

10. The display screen as claimed in claim 9, wherein the second adhesive layer is formed between the step portion and the part of the backlight element.

11. The display screen as claimed in claim 1, wherein the first adhesive layer is a black light-shielding adhesive.

12. The display screen as claimed in claim 1, wherein the display panel further comprises an upper surface, the upper surface is fixedly connected to the cover plate, the lower surface is fixedly connected to the backlight module.

13. The display screen as claimed in claim 1, wherein the first adhesive layer is any one of a hot-melt adhesive, a photosensitive adhesive, and an optical adhesive.

14. An electronic device, comprising a housing, a display screen and a functional component, and the display screen is mounted on the housing, and the display screen comprising:
   a display panel, comprising a lower surface, an upper surface and a side face connected between the lower surface and the upper surface, wherein the display panel defines a first notch exposed from the side face;
   a backlight module, wherein the backlight module comprises a bottom wall, a side wall, a backlight element and a supporting member, the side wall is connected to and surrounding the bottom wall thereby to define a receiving space, the backlight element and the supporting member are received in the receiving space, the side wall comprises two flat portions and a curved portion connected between the two flat portions, the curved portion defines a second notch corresponding to the first notch, the supporting member surrounds the second notch and is only positioned between the curved portion and the backlight element, and the functional component is disposed in the first notch and the second notch;
   a first adhesive layer, formed on side surfaces of the flat portions and the side face of the display panel, thereby connecting the side wall and the display panel;

a second adhesive layer, formed between a top surface of the curved portion, a top surface of the supporting member, and the lower surface of the display panel thereby connecting the side wall, the supporting member and the display panel; and a cover plate, attached to the upper surface of the display panel and covering the functional component.

15. The electronic device as claimed in claim 14, wherein the display panel comprises an upper polarizer, a display layer and a lower polarizer stacked in layers, the first adhesive layer is formed on the side surface of the side wall, a side surface of the lower polarizer, a side surface of the display layer and a side surface of the upper polarizer, the second adhesive layer is formed between the lower polarizer and the top surface of the side wall.

16. The electronic device as claimed in claim 15, wherein the lower polarizer extends outward with respect to the side wall to form a first extended portion, and the first adhesive layer is formed on the first extended portion.

17. The electronic device as claimed in claim 14, wherein the first adhesive layer extends to a side surface of the display layer to cover the connection of an lower polarizer and the display layer, and a second ink layer is disposed between the side face of the display panel, the side surface of side wall and the first adhesive layer.

18. The electronic device as claimed in claim 17, a third adhesive layer is disposed on the first ink layer, and an upper polarizer extends outward with respect to the side wall to form a second extended portion, the third adhesive layer is formed on the second extended portion.

19. An electronic device, comprising:

a housing;

a display module mounted on the housing, the display module comprising:

a display panel, comprising a lower surface, an upper surface and a side face connected between the lower surface and the upper surface, wherein the display panel defines a first notch exposed from the side face;

a backlight module, wherein the backlight module comprises a frame, a backlight element and a supporting member, the frame comprises a bottom wall and a side wall connected to the bottom wall, the side wall, the supporting member and the backlight element are positioned between the bottom wall and the lower surface of the display panel, the side wall comprises two flat portions and a curved portion connected between the two flat portions, the curved portion defines a second notch corresponding to the first notch, the supporting member is positioned between the curved portion and the backlight element, and the supporting member is not positioned between the backlight element and the flat portions;

a first adhesive layer, formed on a side surface of the side wall and the side face of the display panel, thereby connecting the side wall and the display panel;

a second adhesive layer, formed between a top surface of the side wall, a top surface of the supporting member, and the lower surface of the display panel thereby connecting the side wall, the supporting member and the display panel; and a cover plate, attached to the upper surface of the display panel and covering the first notch and the second notch; and a functional component accommodated in the first notch and the second notch.

20. The electronic device as claimed in claim 19, wherein the supporting member surrounds the second notch.

\* \* \* \* \*